(12) United States Patent
Ng et al.

(10) Patent No.: US 9,418,974 B2
(45) Date of Patent: Aug. 16, 2016

(54) STACKED SEMICONDUCTOR DIE ASSEMBLIES WITH SUPPORT MEMBERS AND ASSOCIATED SYSTEMS AND METHODS

(71) Applicant: Micron Technology, Inc., Boise, ID (US)

(72) Inventors: Hong Wan Ng, Singapore (SG); Seng Kim Ye, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/264,584

(22) Filed: Apr. 29, 2014

(65) Prior Publication Data

US 2015/0311185 A1    Oct. 29, 2015

(51) Int. Cl.
*H01L 23/495*    (2006.01)
*H01L 23/48*    (2006.01)
(Continued)

(52) U.S. Cl.
CPC .............. *H01L 25/18* (2013.01); *H01L 24/33* (2013.01); *H01L 24/49* (2013.01); *H01L 24/83* (2013.01); *H01L 24/85* (2013.01); *H01L 25/0657* (2013.01); *H01L 25/50* (2013.01); *H01L 23/3128* (2013.01); *H01L 2224/05554* (2013.01); *H01L 2224/05599* (2013.01); *H01L 2224/32225* (2013.01); *H01L 2224/33181* (2013.01); *H01L 2224/48227* (2013.01);
(Continued)

(58) Field of Classification Search
CPC ... H01L 21/565; H01L 23/3135; H01L 24/32; H01L 25/18; H01L 24/33; H01L 24/49; H01L 24/83; H01L 24/85; H01L 25/0657

USPC .......... 257/676, 686, 684, 730, 777, E25.027; 438/109, 126, 612, 123; 361/810
See application file for complete search history.

(56) References Cited

U.S. PATENT DOCUMENTS 7,220,615 B2    5/2007    Bolken
8,368,192 B1    2/2013    Chen
(Continued)

FOREIGN PATENT DOCUMENTS

KR    1020010073344 A    8/2001
KR    100894173 B1    4/2009
(Continued)

OTHER PUBLICATIONS

International Search Report mailed Aug. 18, 2015 in Application No. PCT/US2015/028138, 18 pages.
Office Action mailed May 4, 2016 in Taiwan Application No. 104113105, 26 pages.

*Primary Examiner* — Long K Tran
*Assistant Examiner* — Dzung Tran
(74) *Attorney, Agent, or Firm* — Perkins Coie LLP

(57) ABSTRACT

Stacked semiconductor die assemblies with support members and associated systems and methods are disclosed herein. In one embodiment, a semiconductor die assembly can include a package substrate, a first semiconductor die attached to the package substrate, and a plurality of support members also attached to the package substrate. The plurality of support members can include a first support member and a second support member disposed at opposite sides of the first semiconductor die, and a second semiconductor die can be coupled to the support members such that at least a portion of the second semiconductor die is over the first semiconductor die.

18 Claims, 10 Drawing Sheets

(51) Int. Cl.
*H01L 23/52* (2006.01)
*H01L 21/44* (2006.01)
*H01L 25/18* (2006.01)
*H01L 25/00* (2006.01)
*H01L 25/065* (2006.01)
*H01L 23/00* (2006.01)
*H01L 23/31* (2006.01)

(52) U.S. Cl.
CPC ............... *H01L 2224/8385* (2013.01); *H01L 2224/83201* (2013.01); *H01L 2224/85399* (2013.01); *H01L 2225/0651* (2013.01); *H01L 2225/06555* (2013.01); *H01L 2225/06562* (2013.01); *H01L 2225/06593* (2013.01); *H01L 2924/00014* (2013.01); *H01L 2924/01014* (2013.01); *H01L 2924/1205* (2013.01); *H01L 2924/143* (2013.01); *H01L 2924/1434* (2013.01); *H01L 2924/15311* (2013.01); *H01L 2924/181* (2013.01); *H01L 2924/19041* (2013.01); *H01L 2924/19042* (2013.01); *H01L 2924/19043* (2013.01); *H01L 2924/19105* (2013.01)

(56) References Cited

U.S. PATENT DOCUMENTS

| | | | |
|---|---|---|---|
| 8,378,483 | B2 | 2/2013 | Mah |
| 2002/0074668 | A1* | 6/2002 | Hofstee et al. ............... 257/777 |
| 2002/0096785 | A1* | 7/2002 | Kimura ........................ 257/778 |
| 2004/0164390 | A1* | 8/2004 | Wang ........................... 257/686 |
| 2005/0196907 | A1 | 9/2005 | Ratificar et al. |
| 2008/0315404 | A1* | 12/2008 | Eichelberger et al. ........ 257/713 |
| 2009/0154513 | A1* | 6/2009 | Shin .............................. 372/36 |
| 2010/0027233 | A1 | 2/2010 | Low et al. |
| 2010/0090350 | A1 | 4/2010 | Chow et al. |
| 2011/0156232 | A1* | 6/2011 | Youn et al. ................... 257/686 |
| 2012/0317332 | A1 | 12/2012 | Kwak et al. |
| 2013/0037802 | A1 | 2/2013 | England et al. |
| 2013/0105989 | A1 | 5/2013 | Pagaila et al. |
| 2013/0258577 | A1 | 10/2013 | Wu et al. |

FOREIGN PATENT DOCUMENTS

| | | |
|---|---|---|
| TW | 200837922 A | 9/2008 |
| TW | 200943440 A | 10/2009 |
| TW | 201349363 A | 12/2013 |

* cited by examiner

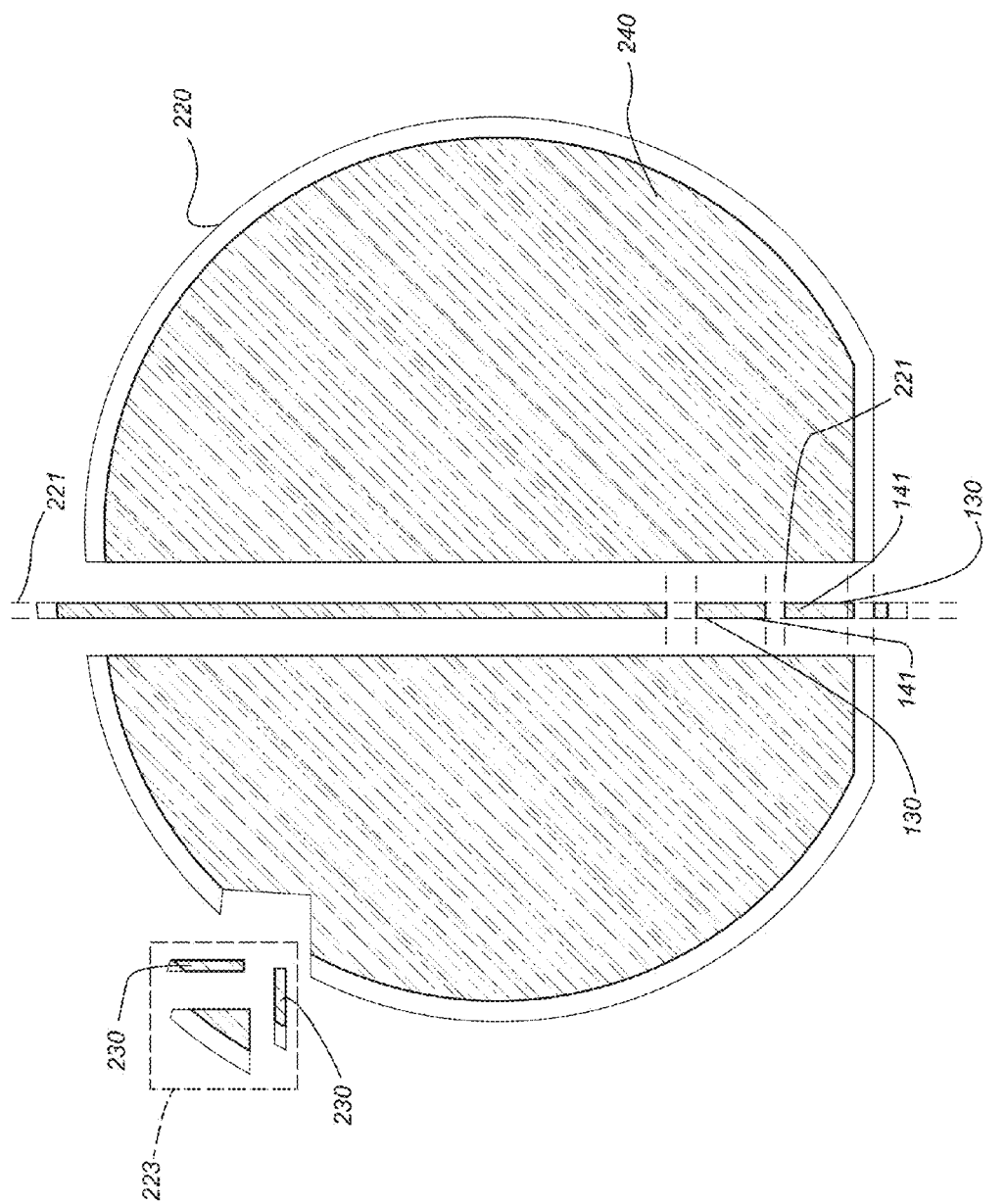

STACKED SEMICONDUCTOR DIE ASSEMBLIES WITH SUPPORT MEMBERS AND ASSOCIATED SYSTEMS AND METHODS

TECHNICAL FIELD

The disclosed embodiments relate to semiconductor die assemblies and to support members in such assemblies. In several embodiments, the present technology relates to die assemblies that can include a controller die and memory dies carried above the controller die.

BACKGROUND

Packaged semiconductor dies, including memory chips, microprocessor chips, and imager chips, can include semiconductor dies mounted on a package substrate. The semiconductor dies are encased in a plastic protective covering, and each die includes functional features, such as memory cells, processor circuits, and imager devices. Bond pads on the dies are electrically connected between the functional features and terminals on the package substrate that allow the dies to be connected to external circuitry.

To increase the density of dies within a package, the dies can be stacked upon one another within the casing. One challenge with vertically stacked dies, however, is that the dies can have different sizes or footprints. For example, in a memory package, a memory controller die can have a smaller footprint than the memory dies within the package. The memory controller die can be more difficult to wirebond because it is offset from the memory dies. Also, the memory dies can sometimes tilt when stacked upon the smaller memory controller die.

BRIEF DESCRIPTION OF THE DRAWINGS

FIG. 2 is a top plan view of a semiconductor wafer that has been cleaved to form support members of the semiconductor die assembly in accordance with an embodiment of the present technology.

DETAILED DESCRIPTION

Specific details of several embodiments of stacked semiconductor die assemblies having spacer support members and associated systems and methods are described below. The term "semiconductor die" generally refers to a die having integrated circuits or components, data storage elements, processing components, and/or other features manufactured on semiconductor substrates. For example, semiconductor dies can include integrated circuit memory and/or logic circuitry. Semiconductor dies and/or other features in semiconductor die packages can be said to be in "thermal contact" with one another if the two structures can exchange energy through heat. A person skilled in the relevant art will also understand that the technology may have additional embodiments, and that the technology may be practiced without several of the details of the embodiments described below with reference to FIGS. 1-7.

As used herein, the terms "vertical," "lateral," "upper" and "lower" can refer to relative directions or positions of features in the semiconductor die assemblies in view of the orientation shown in the Figures. For example, "upper" or "uppermost" can refer to a feature positioned closer to the top of a page than another feature. These terms, however, should be construed broadly to include semiconductor devices having other orientations, such as being flipped on their side or inverted.

Figure 1A:
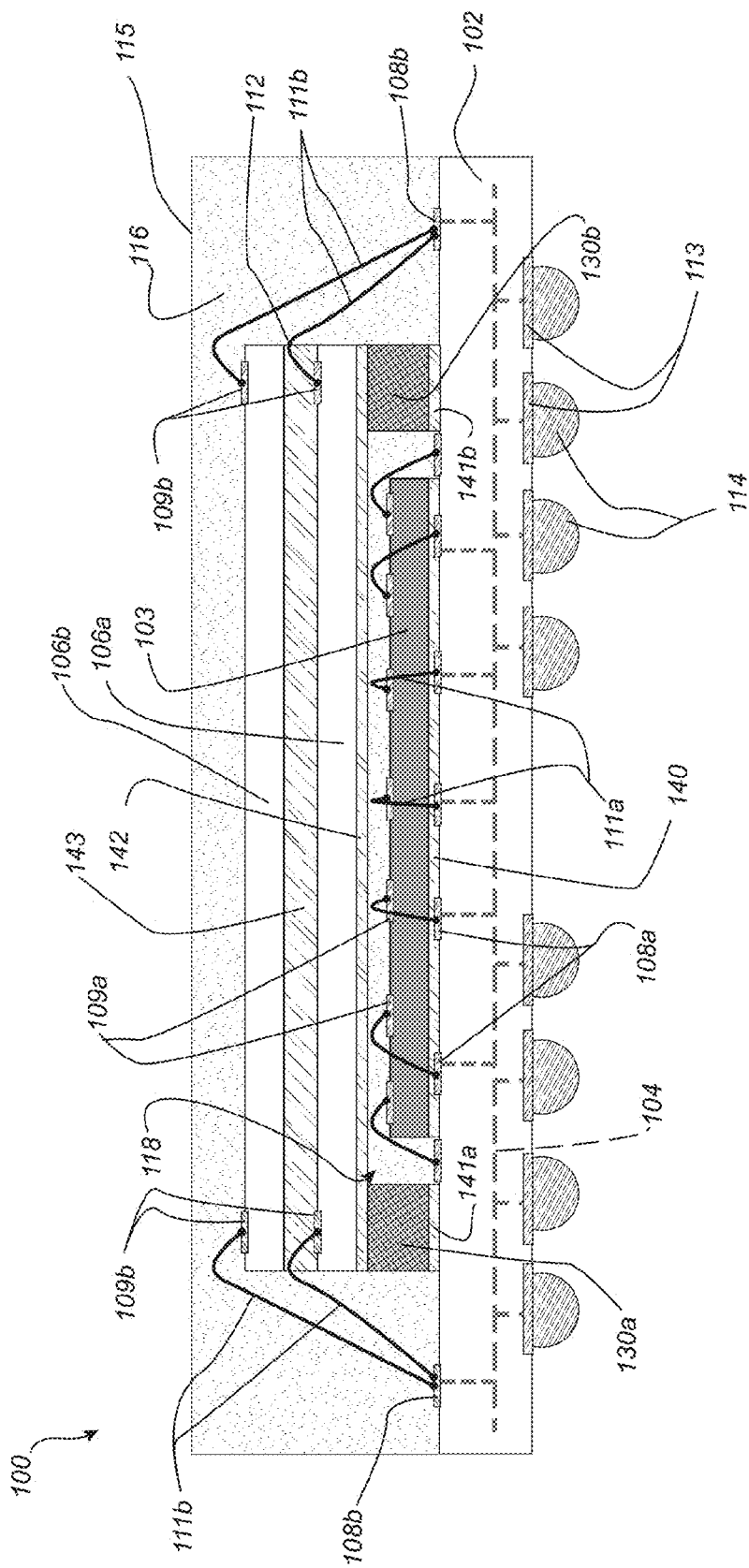
FIG. 1A is a cross-sectional view of a semiconductor die assembly configured in accordance with an embodiment of the present technology.

FIG. 1A is a cross-sectional view of a semiconductor die assembly 100 ("assembly 100") configured in accordance with an embodiment of the present technology. As shown, the assembly 100 includes a package substrate 102 carrying a first semiconductor die, or controller die 103, and first and second support members 130a and 130b (collectively "support members 130") on opposite sides of the controller die 103. The support members 130 carry first and second semiconductor dies, or first and second memory dies 106a and 106b (collectively "memory dies 106"), arranged in a stack above the controller die 103. The package substrate 102 includes a plurality of first bond pads 108a within the footprint (e.g., directly beneath) the first memory die 106a and a plurality of second bond pads 108b outside of the footprint (e.g., not directly beneath) the first memory die 106a. The first bond pads 108a are coupled to corresponding bond pads 109a on the controller die 103 by first wire bonds 111a, and the second bond pads 108b are coupled to corresponding bond pads 109b on each of the memory dies 106 by second wire bonds 111b. The package substrate 102 can include, for example, a printed circuit board or other suitable substrate having electrical connectors 104 (shown schematically), such as metal traces, vias, or other suitable connectors. The electrical connectors 104 can couple the first bond pads 108a and/or the second bond pads 108b to external circuitry (not shown) via package contacts 113 and interconnects 114 (e.g., bump bonds) at the opposite side of the package substrate 102. In several embodiments, the electrical connectors 104 can also couple individual first bond pads 108a with individual second bond pads 108b to electrically intercouple the controller die 103 with the memory dies 106.

The assembly 100 further includes a package casing 115 composed of an encapsulant 116 that at least partially encapsulates the controller die 103, the memory dies 106, and the support members 130. In the illustrated embodiment, the encapsulant 116 also extends into a cavity 118 between the package substrate 102 and the first memory die 106a to at least partially fill the region beneath the first memory die 106a not occupied by the controller die 103 and the support members. In some embodiments, the portion of the encapsulant 116 in the cavity 118 can reinforce the support members 130 and provide further mechanical support beneath the first memory die 106a. The encapsulant 116 can include, for example, a thermoset material, an epoxy resin, or other suitable compound that provides mechanical support, shielding from the ambient environment (e.g., from humidity), and/or electrical isolation (e.g., between wire bonds).

The controller die 103 and the memory dies 106 can each be formed from a semiconductor substrate, such as silicon, silicon-on-insulator, compound semiconductor (e.g., Gallium Nitride), or other suitable substrate. The semiconductor substrate can be cut or singulated into semiconductor dies having any of variety of integrate circuit components or functional features, such as dynamic random-access memory (DRAM), static random-access memory (SRAM), flash memory, other forms of integrated circuit devices, including memory, processing circuits, imaging components, and/or other semiconductor devices. In selected embodiments, the assembly 100 can be configured as a memory in which the memory dies 106 provide data storage (e.g., NAND dies) and the controller die 103 provides memory control (e.g., NAND control). In some embodiments, the assembly 100 can include other semiconductor dies in addition to and/or in lieu of one or more of the controller die 103 and/or the memory dies 106. For example, instead of two memory dies, the assembly 100 can include more than two memory dies (e.g., four dies, eight dies, etc.) or only a single memory die. Further, in various embodiments, the dies of the assembly 100 can have different sizes. For example, in some embodiments one or both of the memory dies 106 can extend beyond the support members 130 at one or more sides.

As further shown in FIG. 1A, the controller die 103 is attached to the package substrate 102 by a die-attach material 140 (e.g., a die-attach film). The first support member 130a is attached to the package substrate 102 by a die-attach material 141a, and the second support member 130b is attached to the package substrate 102 by a die-attach material 141b. The memory dies 106, in turn, are attached to the controller die 103 and the support members 130 by a die-attach material 142 and to one another by a film-over-wire material 143 ("over-wire material 142"). In several embodiments, the die-attach materials 140, 141a-b, and 142 can be formed from the same or similar materials. In some embodiments, the over-wire material 143 can be formed from the same or similar materials 140, 141a-b, and 142, but the over-wire material 143 can have a greater thickness to accommodate a wire portion 112 of the first wire bonds 111a between the memory dies 106. In selected embodiments, the die-attach materials 140, 141a-b, and 142 and the over-wire material 143 can each include a laminate film of epoxy-based material. Such laminate films can include, for example, a die-attach film or a dicing-die-attach film (known to those skilled in the art as "DAFs" or "DDFs," respectively). In one embodiment the die-attach materials and/or film-over wire materials can each include DAFs or DDFs provided by Henkel AG & Co. of Shangai, China (e.g., Model Nos. Ablestick ATB-100, 100U, 100A, 100U).

In some conventional package assemblies, the controller die can be positioned between the package substrate and a stack of memory dies. This configuration is typically formed by encapsulating the controller die with an encapsulant and then the memory dies are stacked upon the surface of the encapsulant. One challenge with encapsulating the controller die at this stage, however, is that it complicates manufacturing. For example, the mounting surface on the encapsulant can be uneven. When the memory dies are stacked on an uneven mounting surface, they can cant or tilt to the extent that the dies project outside of the protective casing. Also, die tilt can make wirebonding more difficult because the wire bonds have different lengths at the opposite sides of the assembly. Another conventional manufacturing technique involves forming a cavity in the package substrate into which the controller die can be inserted. This technique can also complicate manufacturing and increase costs because it requires the package substrate to be milled or etched to form the cavity.

Embodiments of die assemblies configured in accordance with several embodiments of the present technology can address these and other limitations of conventional die assemblies. For example, one advantage is that the stack of memory dies 106 can be mounted to the support members 130 without having to first encapsulate the controller die 103 beneath the memory dies 106. A related advantage is that the high temperature molding and curing steps for encapsulating the controller die can be eliminated and thus reduce thermal cycling. Accordingly, manufacturing can be less complicated because it can eliminate several manufacturing steps. Another advantage is that the support members 130 can have a coefficient of thermal expansion (CTE) that is similar to or the same as the memory dies 106. For example, the support members 130 can be formed from semiconductor materials, such as silicon. Such CTE matching reduces thermal stresses within the package during operation. Yet another advantage is that the memory dies 106 are not prone to tilt because the support members 130 can have the same height and the die-attach materials 140, 141a-b, and 142 can be formed from a laminate film with a uniform thickness.

Figure 1B:
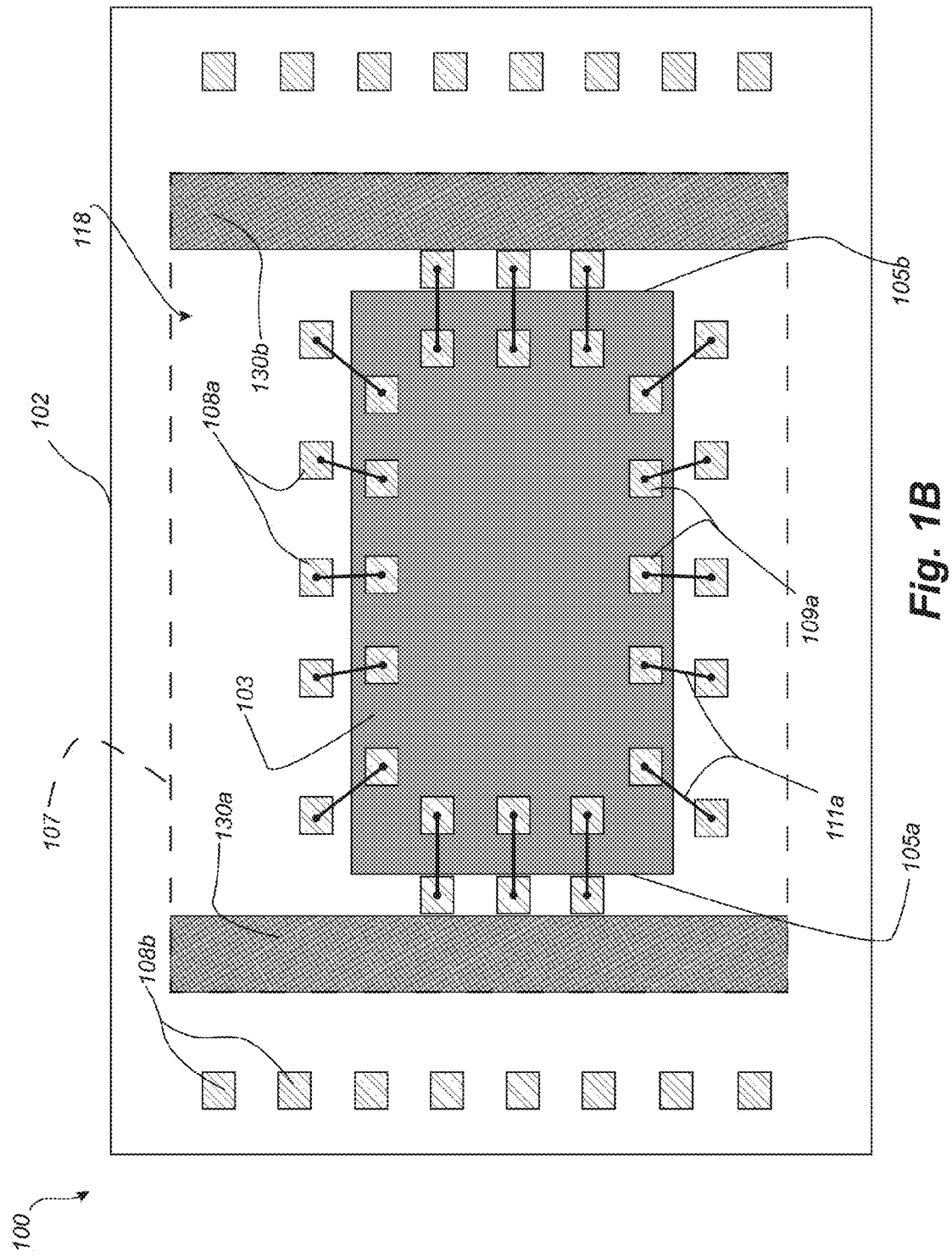
FIG. 1B is a top plan view of the assembly of FIG. 1A with a casing and a semiconductor die stack removed from the assembly.

FIG. 1B is a top plan view of the assembly 100 with the casing 115 and the memory dies 106 shown in FIG. 1A removed for purposes of illustration. As shown, the controller die 103 is located within a perimeter, or footprint 107 (shown in hidden lines), of the stack of memory dies 106 (FIG. 1A) superimposed on the package substrate 102. The first and second support members 130a and 130b are also positioned within the footprint 107 and extend along first and second sides 105a and 105b, respectively, of the controller die 103. In several embodiments, the support members 130 can each include an elongate member formed from an interposer substrate, a printed circuit board, a semiconductor wafer or die, or another suitable support material. In one embodiment described in greater detail below, the support members 130 can be pieces of semiconductor material that are cleaved (e.g., diced or singulated) from a semiconductor wafer or die, such as a "blank" silicon wafer or die.

FIG. 2 is a top plan view of a semiconductor wafer 220 that has been cleaved to form the support members 130 with die attach materials 141 in accordance with an embodiment of the present technology. In the illustrated embodiment, the support members 130 are formed by first covering the semiconductor wafer 220 with a die-attach material 240 (e.g., a die-attach film) and then simultaneously cutting the wafer 220 and the die-attach material 240 along multiple dicing lines 221. Once cut, the support members 130 can then be attached to the package substrate 102 (FIG. 1A) via the die-attach materials 141 formed from the respective portions of die-attach material 240. In one embodiment, the support members 130 can be formed from a blank silicon wafer. In another embodiment, support members can be formed from portions of a semiconductor wafer that might otherwise be discarded. For example, support members 230 can be formed from an edge portion 223 of the semiconductor wafer 220 left over after die singulation. In additional or alternate embodiments, non-yielding or non-functioning dies can also be cut into multiple pieces to form individual spacer members.

Figure 3A:
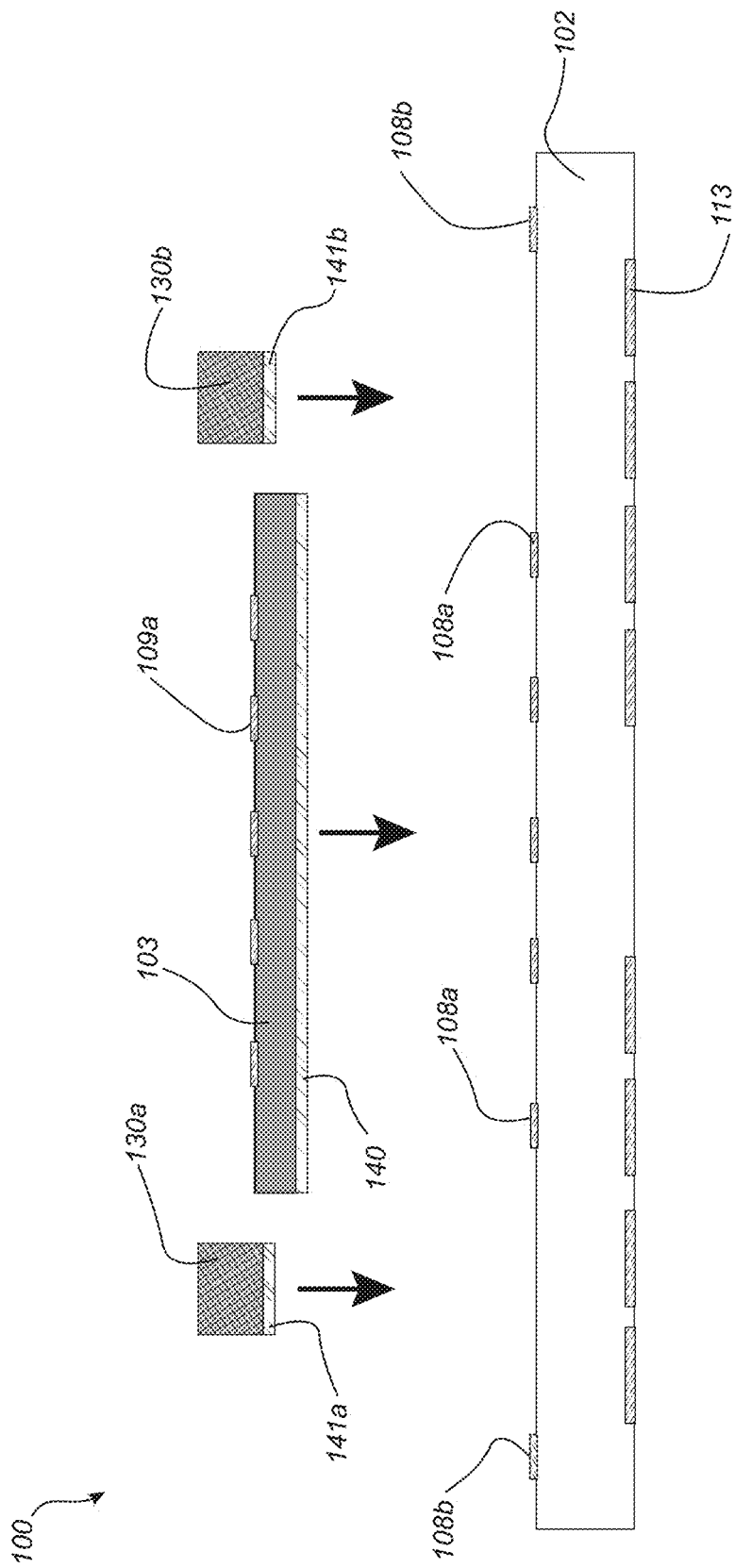
FIGS. 3A-3C are cross-sectional views illustrating the semiconductor die assembly of FIG. 1A at various stages of manufacture in accordance with an embodiment of the present technology.
Figure 3B:
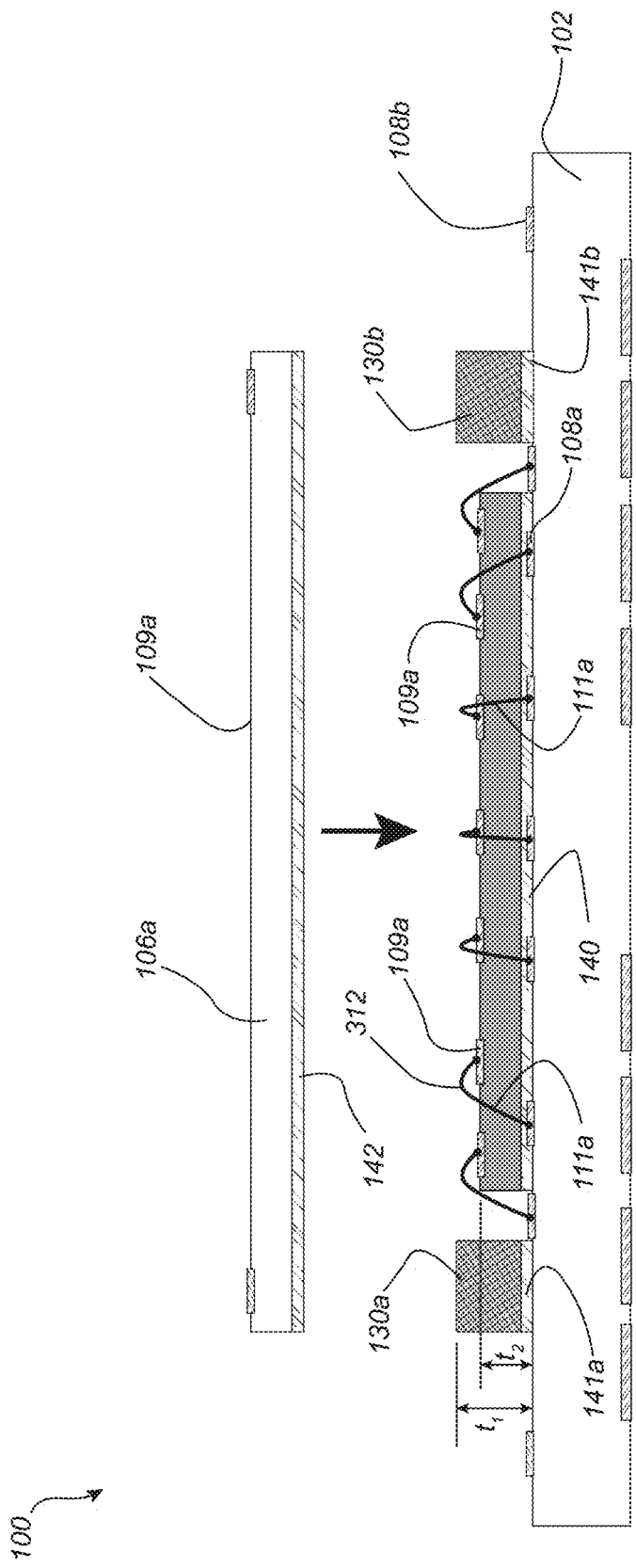
Figure 3C:
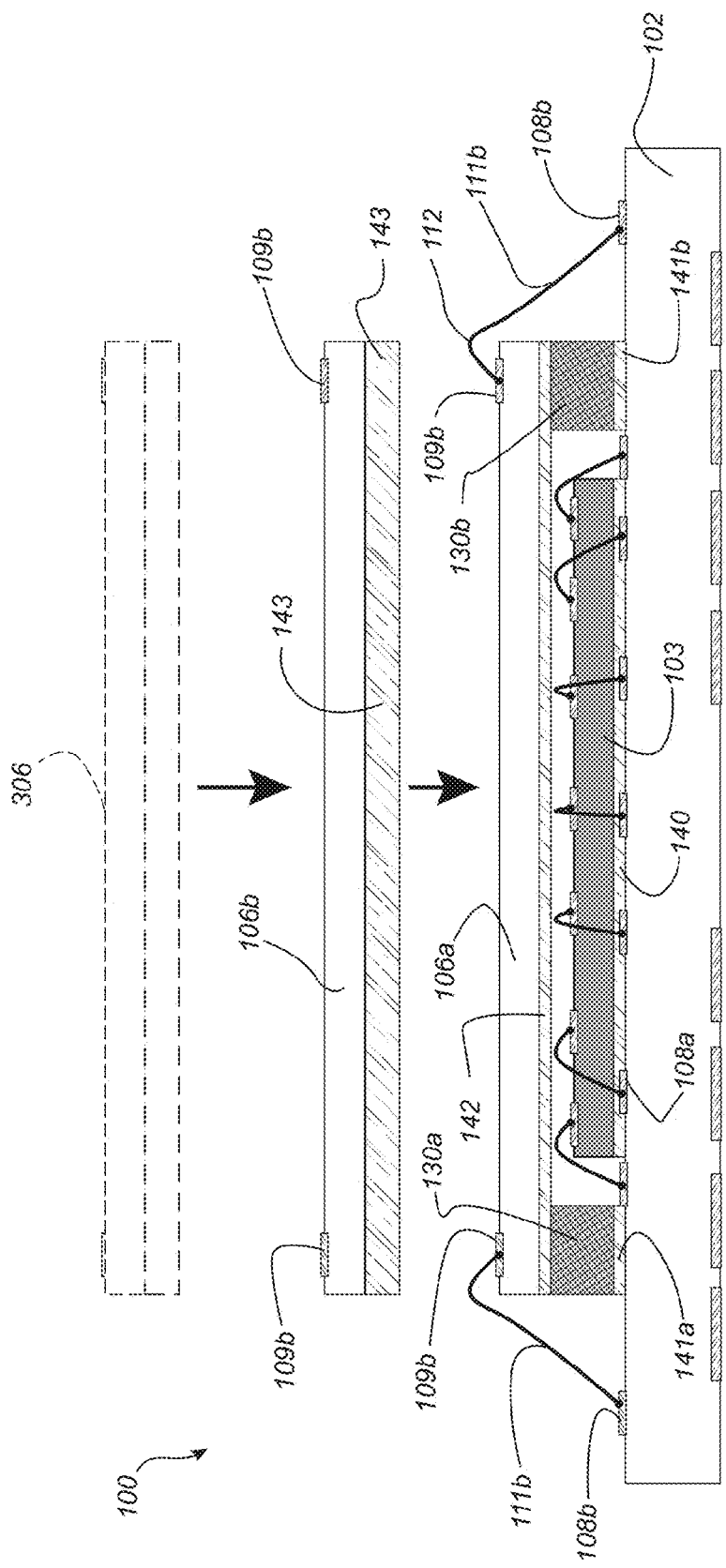

FIGS. 3A-3C are cross-sectional views illustrating the assembly 100 at various stages of manufacture in accordance with an embodiment of the present technology. Referring first to FIG. 3A, the controller die 103 is attached to the package substrate 102 with the die-attach material 140, and the first and second support members 130a-b are attached to the package substrate with die-attach materials 141 a-b, respectively. In one embodiment, one or more of the die-attach materials 140 and 141a-b can include a pressure-set film that adheres materials together when it is compressed (e.g., between the package substrate 102 and each of the support members 130) beyond a threshold level of pressure. In another embodiment, one or more of the die-attach materials 140 and 141a-b can be a UV-set film that is set by exposure to UV radiation.

FIG. 3B shows the assembly 100 after forming the first wirebonds 111a between the first bond pads 108a of the package substrate 102 and the corresponding bond pads 109a of the controller die 103. As shown, the support members 130 can have a first thickness $t_1$ that is greater than a second thickness $t_2$ of the controller die 103. In several embodiments, the first and second thicknesses $t_1$ and $t_2$ can be selected such that a wire portion 312 of each of the first wirebonds 111a does not contact the die-attach material 142 when the first memory die 106a is mounted to the support members 130. In another embodiment, the thicknesses $t_1$ and $t_2$ can be selected such that the wire portion 312 projects at least partially into the die-attach material 142. In either case, once the first wirebonds 111a are formed, the first memory die 106a can be attached to the support members 130 via the die-attach material 142.

FIG. 3C shows the assembly 100 after forming the second wirebonds 111b between the second bond pads 108b of the package substrate 102 and the corresponding bond pads 109b of the first memory die 106a. After the second wirebonds 111b are formed, the second memory die 106b can be attached to the first memory die 106a with the over-wire material 143. Once the memory dies 106 are attached to one another, processing can continue with subsequent manufacturing stages. For example, processing can continue by wire bonding the second memory die 106b to the package substrate 102 and then molding the package casing 115 (FIG. 1A) over the die stack. In some embodiments, one or more additional memory dies 306 (shown in hidden lines) can be stacked above the second memory die 106b and wirebonded to the second bond pads 108b of the package substrate 102.

Figure 4:
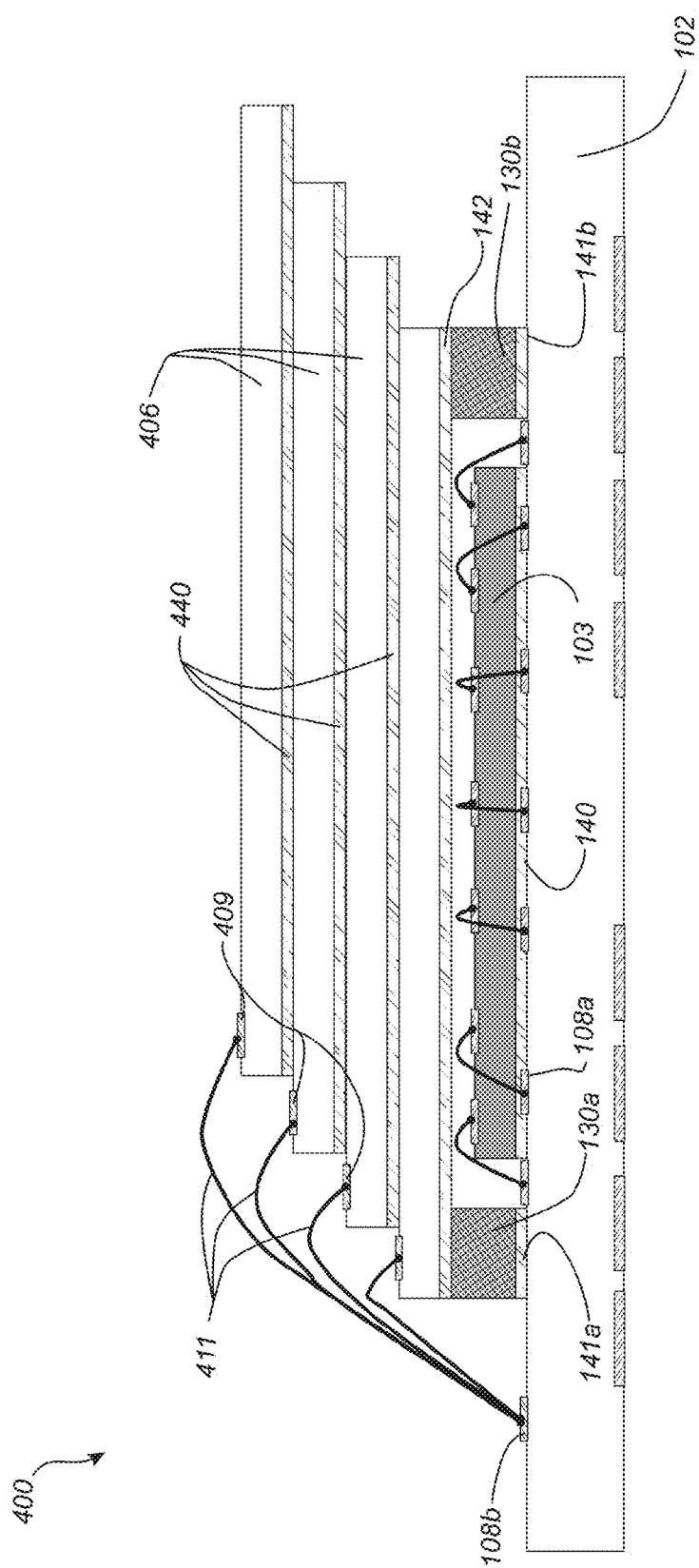
FIG. 4 is a cross-sectional view of a semiconductor die assembly configured in accordance with another embodiment of the present technology.

FIG. 4 is a cross-sectional view of a semiconductor die assembly 400 ("assembly 400") configured in accordance with another embodiment of the present technology. The assembly 400 can include features generally similar to those of the assembly 100 described in detail above. For example, the assembly 400 includes the controller die 103 and the support members 130 attached to the package substrate 120 by the die-attach materials 140 and 141a-b. In the arrangement shown in FIG. 4, individual memory dies 406 are staggered such that individual bond pads 409 of the memory dies 406 are exposed along at least one edge of the stack of memory dies 406. In one aspect of this embodiment, wirebonds 411 can be bonded to the exposed bond pads 409 such that they are not covered by a film-over-wire material (e.g., the over-wire material 143 of FIG. 1A). As such, the memory dies 406 can be assembled using a relatively thinner die-attach material 440 than a film-over-wire material. Also, the stack of memory dies 406 can have a smaller height than a stack of the same number of memory dies attached together with the thicker film-over-wire material.

Figure 5:
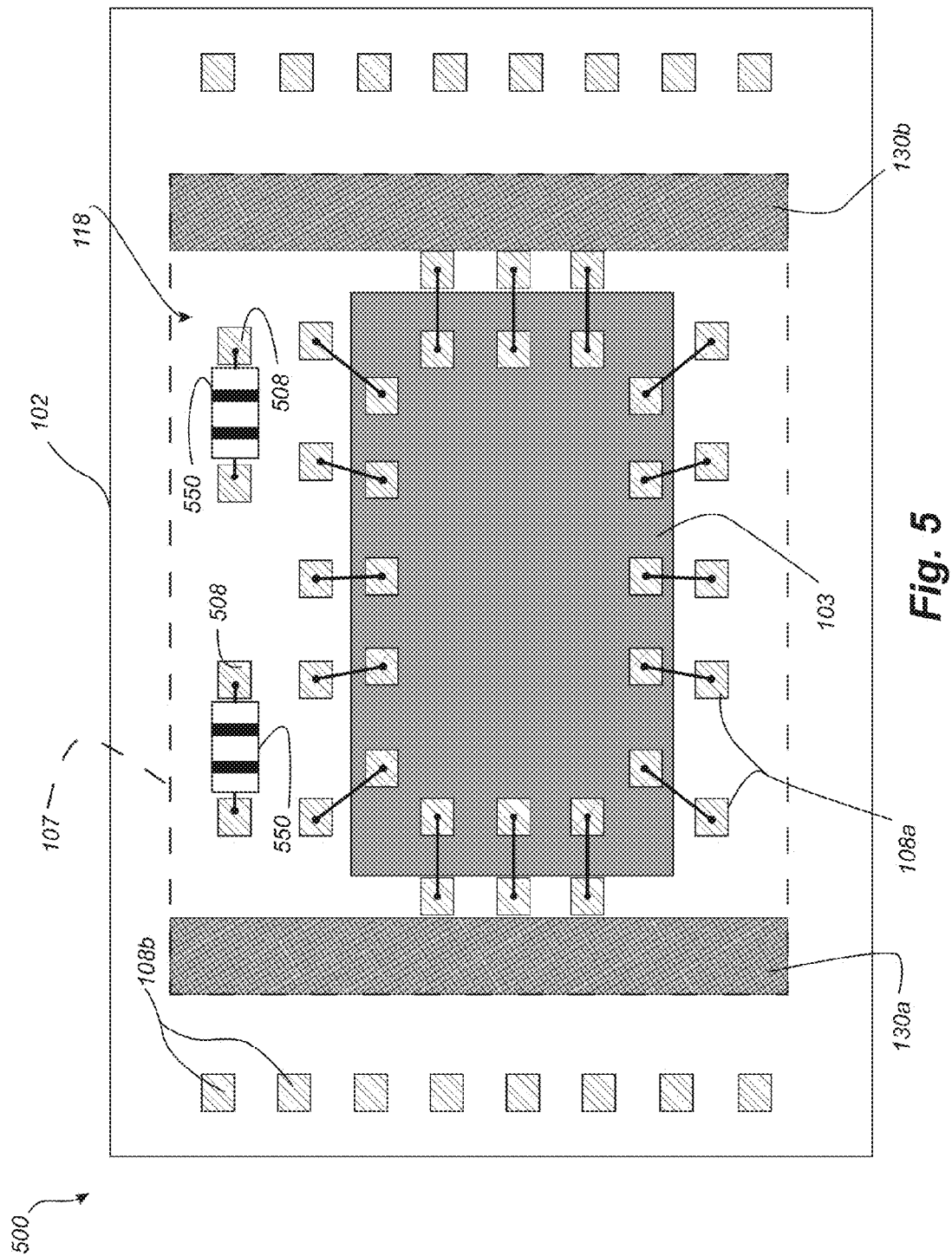
FIG. 5 is a top plan view of a semiconductor die assembly configured in accordance with another embodiment of the present technology.

FIG. 5 is a top plan view of a semiconductor die assembly 500 ("assembly 500") configured in accordance with another embodiment of the present technology. The assembly 500 can include features generally similar to those of the assemblies described in detail above. For example, the assembly 500 includes the controller die 103 positioned within the footprint 107 of the memory dies 106 (FIG. 1A). In the illustrated embodiment of FIG. 5, the assembly 500 can also include capacitors 550 also within the footprint 107 and coupled to the package substrate 102 via bond pads 508. The capacitors 550 can include, for example, monolithic (e.g., ceramic), integrated circuit, or other suitable capacitor devices. In several embodiments, the capacitors 550 can be configured to condition power signals or facilitate power-up. In other embodiments, the assembly 500 can include additional or alternate circuit elements (e.g., inductors, resistors, and/or diodes) and/or circuit components, such as another semiconductor dies at least partially within the footprint 107.

Figure 6A:
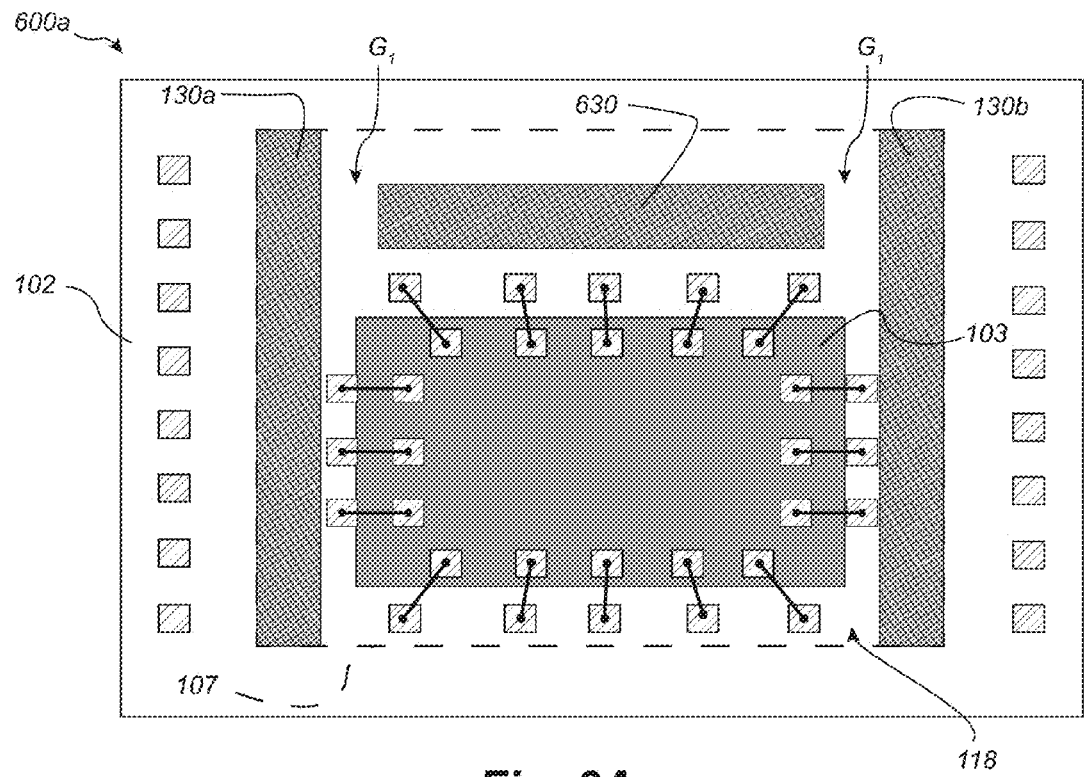
FIGS. 6A and 6B are top plan views illustrating semiconductor die assemblies configured in accordance with several embodiments of the present technology.
Figure 6B:
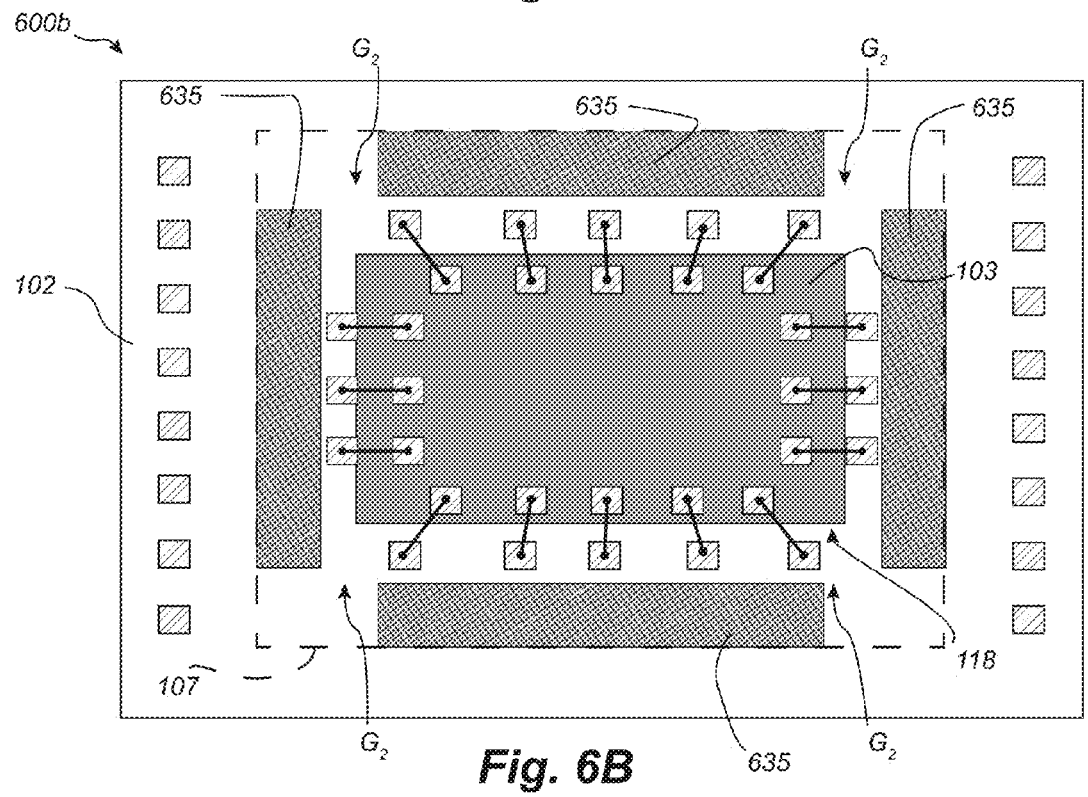

FIGS. 6A and 6B are top plan views illustrating semiconductor die assemblies 600a and 600b, respectively, configured in accordance with several embodiments of the present technology. The assemblies 600a and 600b can each include features generally similar to those of the assemblies described in detail above. For example, the semiconductor die assemblies 600a and 600b can each include the cavity 118 between the package substrate 102 and the memory dies 106 (FIG. 1A) formed by the support members 130.

Referring to FIG. 6A, the semiconductor die assembly 600a includes a third support member 630 (e.g., an elongate member) extending in a direction generally transverse to each of the support members 130. In one aspect of this embodiment, the third support member 630 can be spaced apart from the support members 130 by gaps $G_1$ on opposite sides of the third support member 630 to facilitate flow of the encapsulant 116 into the cavity 118 to form the casing 115 (FIG. 1A). Referring to FIG. 6B, the semiconductor die assembly 600b can include support members 635 positioned at each side the controller die 103. Similar to the third support member 630 shown in FIG. 6A, the support members 635 can be separated from the support members by gaps $G_2$ to facilitate flow of the encapsulant 116 into the cavity 118.

Figure 7:
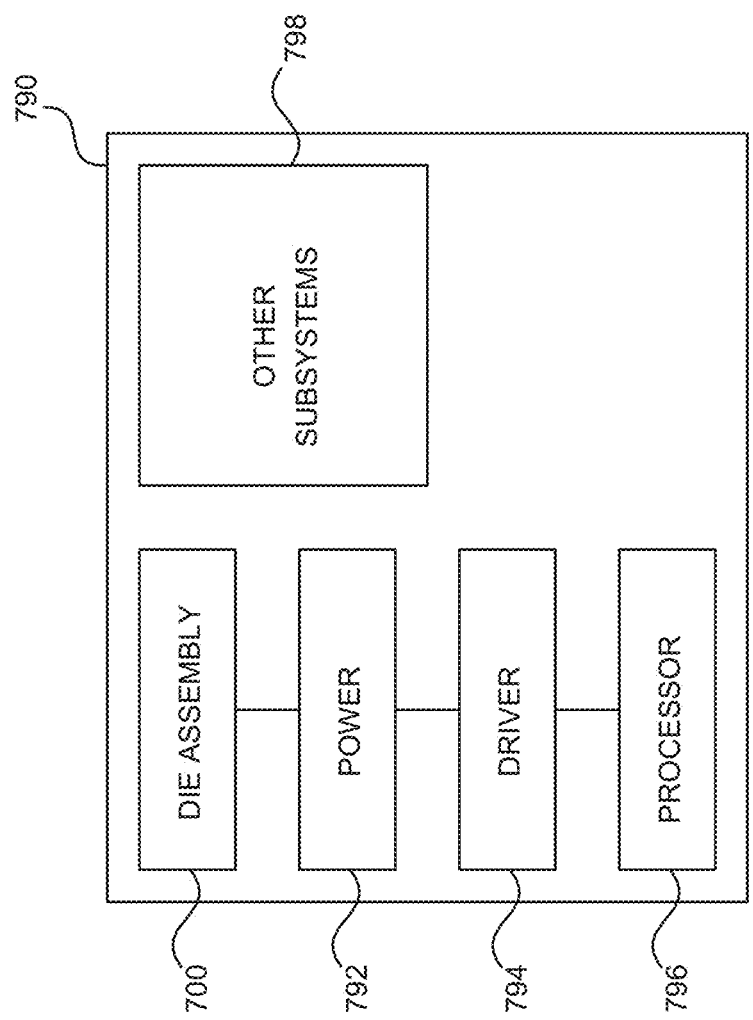
FIG. 7 is a schematic view of a system that includes a semiconductor die assembly configured in accordance with embodiments of the present technology.

Any one of the stacked semiconductor die assemblies described above with reference to FIGS. 1-6B can be incorporated into any of a myriad of larger and/or more complex systems, a representative example of which is system 790 shown schematically in FIG. 7. The system 790 can include a semiconductor die assembly 700, a power source 792, a driver 794, a processor 796, and/or other subsystems or components 798. The semiconductor die assembly 700 can include features generally similar to those of the stacked semiconductor die assemblies described above. The resulting system 790 can perform any of a wide variety of functions, such as memory storage, data processing, and/or other suitable functions. Accordingly, representative systems 790 can include, without limitation, hand-held devices (e.g., mobile phones, tablets, digital readers, and digital audio players), computers, and appliances. Components of the system 790 may be housed in a single unit or distributed over multiple, interconnected units (e.g., through a communications network). The components of the system 790 can also include remote devices and any of a wide variety of computer readable media.

From the foregoing, it will be appreciated that specific embodiments of the technology have been described herein for purposes of illustration, but that various modifications may be made without deviating from the disclosure. Also, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the

We claim:

1. A semiconductor die assembly, comprising:
a package substrate including a plurality of first bond pads;
a first semiconductor die attached to the package substrate, the first semiconductor die including a plurality of second bond pads;
a plurality of support members attached to the package substrate, the plurality of support members including a first support member and a second support member disposed on opposite sides of the first semiconductor die;
a second semiconductor die coupled to the plurality of support members such that at least a portion of the second semiconductor die is over the first semiconductor die, wherein the second semiconductor die extends over the second bond pads; and
a first die-attach film attaching each of the support members to the second semiconductor die, but not attaching the first semiconductor die to the second semiconductor die,
wherein the first die-attach film extends between the second semiconductor die and the first semiconductor die and between the second semiconductor die and each of the support members, and wherein the first die-attach film has a uniform thickness;
a second die-attach film attaching one of the support members to the package substrate;
a third die-attach film attaching the first semiconductor die to the package substrate; and
a plurality of wire bonds electrically coupling the first bond pads to corresponding ones of the second bond pads,
wherein the first bond pads are between the second and third die attach films, and wherein the wirebonds do not contact the first die attach film.

2. The semiconductor die assembly of claim 1 wherein the package substrate further includes a plurality of third bond pads electrically coupled to the second semiconductor die, wherein the third bond pads extend outside of the second semiconductor die.

3. The semiconductor die assembly of claim 2, wherein the wirebonds are first wirebonds, and wherein the semiconductor die assembly further comprises a plurality of second wirebonds electrically coupling the third bond pads to corresponding bond pads of the second semiconductor die.

4. The semiconductor die assembly of claim 1 wherein the plurality of support members, the second semiconductor die, and the package substrate together define a cavity beneath the second semiconductor die, and wherein the semiconductor die assembly further comprises a package casing that includes an encapsulant at least partially extending into the cavity.

5. The semiconductor die assembly of claim 1 wherein the first semiconductor die does not contact the die attach film.

6. The semiconductor die assembly of claim 1 wherein the first die attach film includes a pressure-set film.

7. The semiconductor die assembly of claim 1 wherein the first semiconductor die is a memory die, and wherein the second memory die is a controller die.

8. The semiconductor die assembly of claim 7 wherein the memory die is a first memory die, and wherein the semiconductor die assembly further includes a second memory die stacked upon the first memory die.

9. The semiconductor die assembly of claim 1 wherein each of the support members includes an elongate member.

10. The semiconductor die assembly of claim 9 wherein the elongate member of one of the support members is in parallel with the elongate member of another one of the support members.

11. The semiconductor die assembly of claim 9 wherein the elongate member of one of the support members is perpendicular to the elongate member of another one of the support members.

12. The semiconductor die assembly of claim 9 wherein the elongate member of each of the support members comprises silicon.

13. A semiconductor die assembly, comprising:
a package substrate including a plurality of first bond pads;
a plurality of support members attached to and spaced apart from one another on the package substrate;
a first semiconductor die attached to the package substrate, positioned between the support members, and including a plurality of second bond pads;
a second semiconductor die coupled to the support members such that at least a portion of the second semiconductor die is over the first semiconductor die, wherein the second semiconductor die extends over the second bond pads; and
a first die-attach film attaching each of the support members to the second semiconductor die, but not attaching the first semiconductor die to the second semiconductor die,
wherein the first die-attach film extends between the second semiconductor die and the first semiconductor die and between the second semiconductor die and each of the support members;
a second die-attach film attaching one of the support members to the package substrate;
a third die-attach film attaching the first semiconductor die to the package substrate, wherein the first bond pads are between the second and third die attach films; and
a plurality of wire bonds electrically coupling the first bond pads to corresponding ones of the second bond pads, wherein the wirebonds are below the first die attach film.

14. The semiconductor die assembly of claim 13 wherein the first die-attach film has a uniform thickness.

15. The semiconductor die assembly of claim 13 wherein the wirebonds do not contact the first die attach film.

16. The semiconductor die assembly of claim 13 wherein the first semiconductor die is a memory die, and wherein the second semiconductor die is a controller die.

17. The semiconductor die assembly of claim 16, further comprising a circuit component positioned below the memory die and at least partially within a footprint of the memory die, wherein the circuit component is separated from the controller die on the package substrate.

18. The semiconductor die assembly of claim 17 wherein the circuit component is a capacitor.

* * * * *